US007308665B2

(12) United States Patent
Homma

(10) Patent No.: US 7,308,665 B2
(45) Date of Patent: Dec. 11, 2007

(54) METHOD AND APPARATUS FOR ANALYZING CLOCK-DELAY, AND COMPUTER PRODUCT

(75) Inventor: Katsumi Homma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/167,311

(22) Filed: Jun. 28, 2005

(65) Prior Publication Data

US 2006/0236280 A1     Oct. 19, 2006

(30) Foreign Application Priority Data

Mar. 24, 2005    (JP)   ............. 2005-086145

(51) Int. Cl.
     *G06F 17/50*      (2006.01)
(52) U.S. Cl. ............................. 716/6; 716/5
(58) Field of Classification Search ................ 716/4–6, 716/45, 18
See application file for complete search history.

(56) References Cited

U.S. PATENT DOCUMENTS

| | | | | |
|---|---|---|---|---|
| 6,090,150 A * | 7/2000 | Tawada | ...................... | 703/19 |
| 6,367,060 B1 * | 4/2002 | Cheng et al. | ................. | 716/10 |
| 6,654,712 B1 * | 11/2003 | Blair | ............................ | 703/14 |
| 6,684,374 B2 * | 1/2004 | Ito et al. | ......................... | 716/6 |
| 6,701,498 B2 * | 3/2004 | Becker et al. | ................. | 716/6 |
| 6,799,308 B2 * | 9/2004 | You et al. | ...................... | 716/6 |
| 6,944,840 B2 * | 9/2005 | Sasaki et al. | .................. | 716/6 |
| 7,075,336 B2 * | 7/2006 | Kojima et al. | ................ | 326/93 |

FOREIGN PATENT DOCUMENTS

JP        7-182381        7/1995

* cited by examiner

*Primary Examiner*—Jack Chiang
*Assistant Examiner*—Binh Tat
(74) *Attorney, Agent, or Firm*—Staas & Halsey LLP

(57) ABSTRACT

An input unit receives circuit information on a circuit. A first calculating unit calculates delay-distribution information of a data path and delay-distribution information of a clock path, based on the circuit information. A second calculating unit calculates delay-difference-distribution information between the data path and the clock path by using the delay-distribution information of the data path and the delay-distribution information of the clock path. A third calculating unit calculates a clock-delay value of the circuit based on the delay-difference-distribution information.

9 Claims, 7 Drawing Sheets

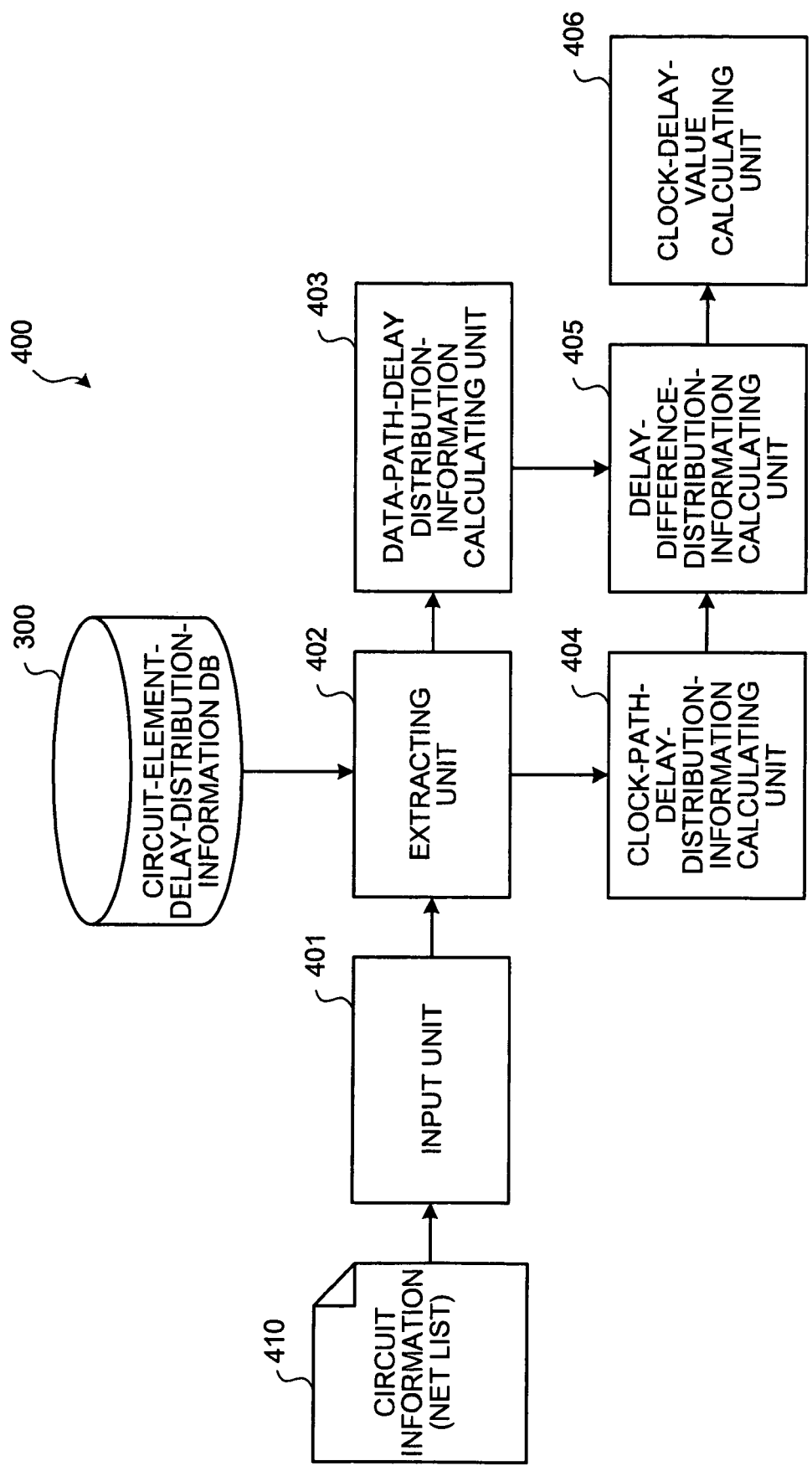

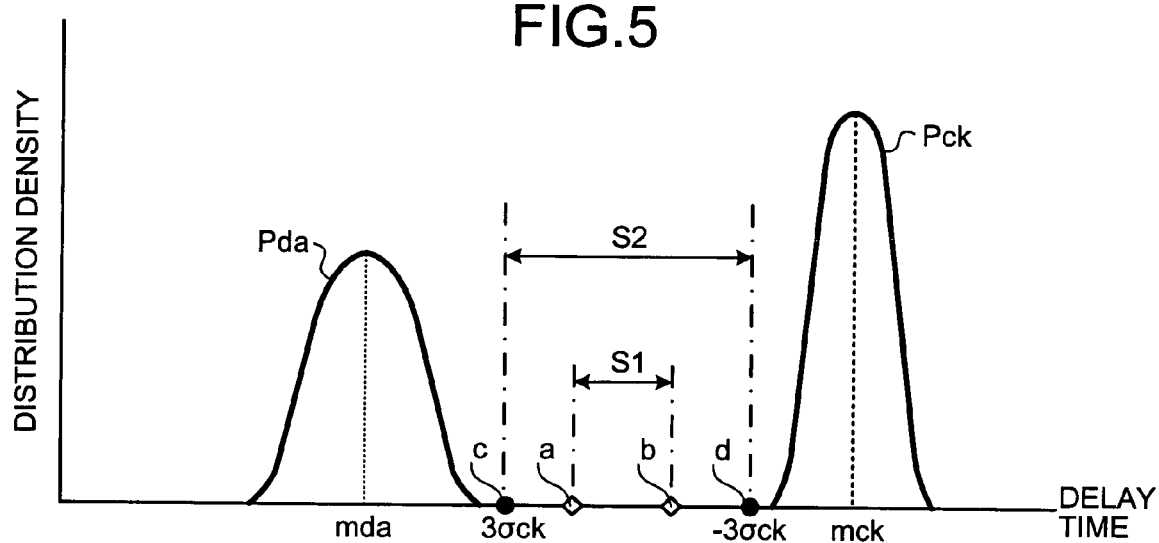
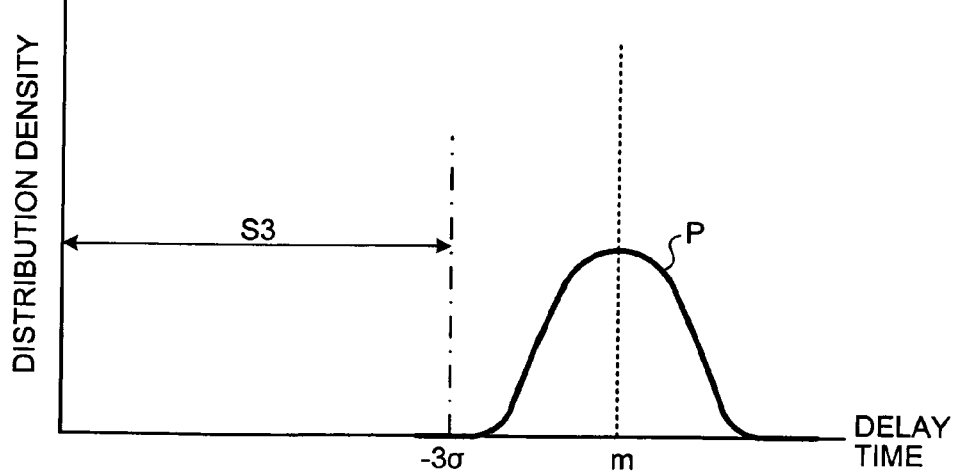

METHOD AND APPARATUS FOR ANALYZING CLOCK-DELAY, AND COMPUTER PRODUCT

CROSS-REFERENCE TO RELATED APPLICATIONS

This application is based upon and claims the benefit of priority from the prior Japanese Patent Application No. 2005-086145, filed on Mar. 24, 2005, the entire contents of which are incorporated herein by reference.

BACKGROUND OF THE INVENTION

1. Field of the Invention

The present invention relates to a technology for analyzing a clock-delay in a circuit such as a large-scale integrated circuit (LSI).

2. Description of the Related Art

In recent years, influence of a statistical factor such as a process fluctuation on very-large-scale integrated circuit (VLSI) manufacturing becomes large due to fineness of a process. To manufacture circuits having a performance required in VLSI design with an excellent yield, it is necessary to estimates the influence in advance. In the conventional art, therefore, estimation of a clock-delay value in an object circuit is performed by a so-called statistical approach.

The statistical approach will be explained briefly with reference to FIG. 5. A difference S2 between a statistical minimum delay value "d" obtained from a delay distribution Pck of clock path in an object circuit and a statistical maximum delay value "c" obtained from a delay distribution Pda of data path is a clock-delay value in the statistical approach. As a related conventional approach, there is an approach disclosed in Japanese Patent Application Laid-Open No. 07-182381. In the approach disclosed in the above literature, a delay time analysis considering fluctuation in mutual delay between the data path and the clock path is performed.

In the conventional approach, however, there is such a problem that it is difficult to handle the statistical factor accurately. For example, when the statistical factor is handled by a conventional static delay analysis (STA), the clock-delay value is estimated based upon the worst value in the factor, namely, a difference between the statistical minimum delay value of data path and the statistical maximum delay value of clock path, so that there is such a problem that only a considerably pessimistic result can be obtained.

Therefore, there is such a problem that such a possibility occurs that a design margin cannot be satisfied so that a circuit cannot be designed. Particularly, when the statistical approach is employed, since a clock-delay value based upon the difference between the statistical minimum delay value of data path and the statistical maximum delay value of clock path is stochastically fluctuated, which results in an unstable clock-delay value and causes quality reduction in static delay analysis.

SUMMARY OF THE INVENTION

It is an object of the present invention to at least solve the problems in the conventional technology.

An apparatus according to one aspect of the present invention, which is for analyzing a clock delay in a circuit, includes an input unit that receives circuit information on the circuit; a first calculating unit that calculates first delay-distribution information of a data path of the circuit by using second delay-distribution information of each of a plurality of circuit elements constituting the data path, and calculates third delay-distribution information of a clock path of the circuit by using fourth delay-distribution information of each of a plurality of circuit elements constituting the clock path, based on the circuit information received; a second calculating unit that calculates delay-difference-distribution information between the data path and the clock path by using the first delay-distribution information and the third delay-distribution information calculated; and a third calculating unit that calculates a clock-delay value of the circuit based on the delay-difference-distribution information calculated.

A method according to another aspect of the present invention, which is for analyzing a clock delay in a circuit, includes receiving circuit information on the circuit; a first calculating including calculating first delay-distribution information of a data path of the circuit by using second delay-distribution information of each of a plurality of circuit elements constituting the data path, and calculating third delay-distribution information of a clock path of the circuit by using fourth delay-distribution information of each of a plurality of circuit elements constituting the clock path, based on the circuit information received; a second calculating including calculating delay-difference-distribution information between the data path and the clock path by using the first delay-distribution information and the third delay-distribution information calculated; and a third calculating including calculating a clock-delay value of the circuit based on the delay-difference-distribution information calculated.

A computer-readable recording medium according to still another aspect of the present invention stores a computer program that causes a computer to execute the above method according to the present invention.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a block diagram showing a functional configuration of the clock-delay analyzing apparatus according to the present embodiment;

FIG. 5 is a graph showing a delay distribution of data path and a delay distribution of clock path;

FIG. 6 is a graph showing a delay difference distribution according to the present embodiment;

DETAILED DESCRIPTION OF THE PREFERRED EMBODIMENTS

Exemplified embodiment of the present invention will be explained below in detail with reference to the accompanying drawings.

Figure 1:
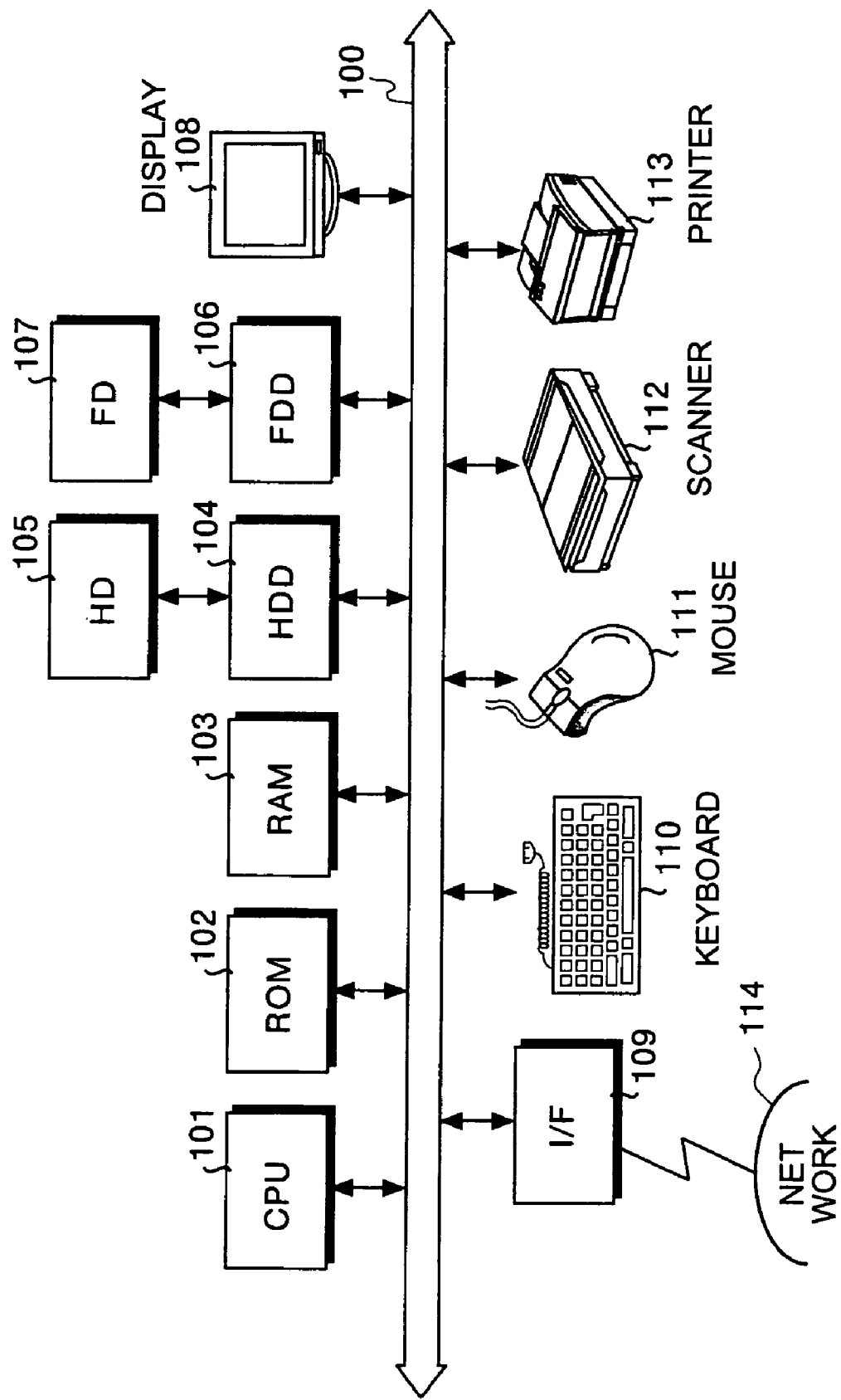
FIG. 1 is a block diagram showing a hardware configuration of a clock-delay analyzing apparatus according to an embodiment of the present invention.

FIG. 1 is a block diagram showing a hardware configuration of a clock-delay analyzing apparatus according to an embodiment of the present invention. The clock-delay analyzing apparatus includes a central processing unit (CPU) 101, a read only memory (ROM) 102, a random access memory (RAM) 103, a hard disc drive (HDD) 104, a hard disk (HD) 105, a flexible disk drive (FDD) 106, a flexible disk (FD) 107 as a detachable recording medium, a display 108, an interface (I/F) 109, a keyboard 110, a mouse 111, a scanner 112, and a printer 113. All the constituent units are connected via a bus 100.

The CPU 101 serves to control the entire of the clock-delay analyzing apparatus. The ROM 102 stores programs such as a boot program. The RAM 103 is used as a work area for the CPU 101. The HDD 104 controls read/write of data to the HD 105 according to control of the CPU 101. The HD 105 stores data written under control of the HDD 104.

The FDD 106 controls read/write of data to the FD 107 according to control of the CPU 101. The FD 107 stores data written under control of the FDD 106 or causes the clock-delay analyzing apparatus to read data stored in the FD 107.

The detachable recording medium can be a compact disc-read only memory (CD-ROM), a compact disc-recordable (CD-R), a compact disc-rewritable (CD-RW), a magneto-optical (MO) disk, a digital versatile disk (DVD), or a memory card other than the FD 107. The display 108 displays not only a cursor, an icon, a toolbox, but also data such as a document, an image, or functional information. The display 108 can be a cathode ray tube (CRT), a thin-film-transistor (TFT) liquid crystal display, or a plasma display.

The I/F 109 is connected to a network 114 such as Internet via a communication line, and it is connected to another apparatus via the network 114. The I/F 109 serves as an interface between the network 114 and internal devices in the clock-delay analyzing apparatus, and it controls input/output of data from/to an external apparatus. As the I/F 109, a modem, a local-area-network (LAN) adapter, or the like can be adopted.

The keyboard 110 is provided with keys for inputting characters, numerals, various instructions, or the like, and it allows data inputting. The keyboard 110 can be an input pad or a ten key of a touch panel type. The mouse 111 is for performing movement and range selection of the cursor or movement of a window or size change thereof. The mouse 111 may be track ball, a joystick, or the like, if it is provided with similar functions as a pointing device.

The scanner 112 optically reads an image to take image data into the clock-delay analyzing apparatus. Incidentally, the scanner 112 may have an OCR function. The printer 113 prints image data or document data. As the printer 113, for example, a laser printer or an inkjet printer may be employed.

Figure 2:
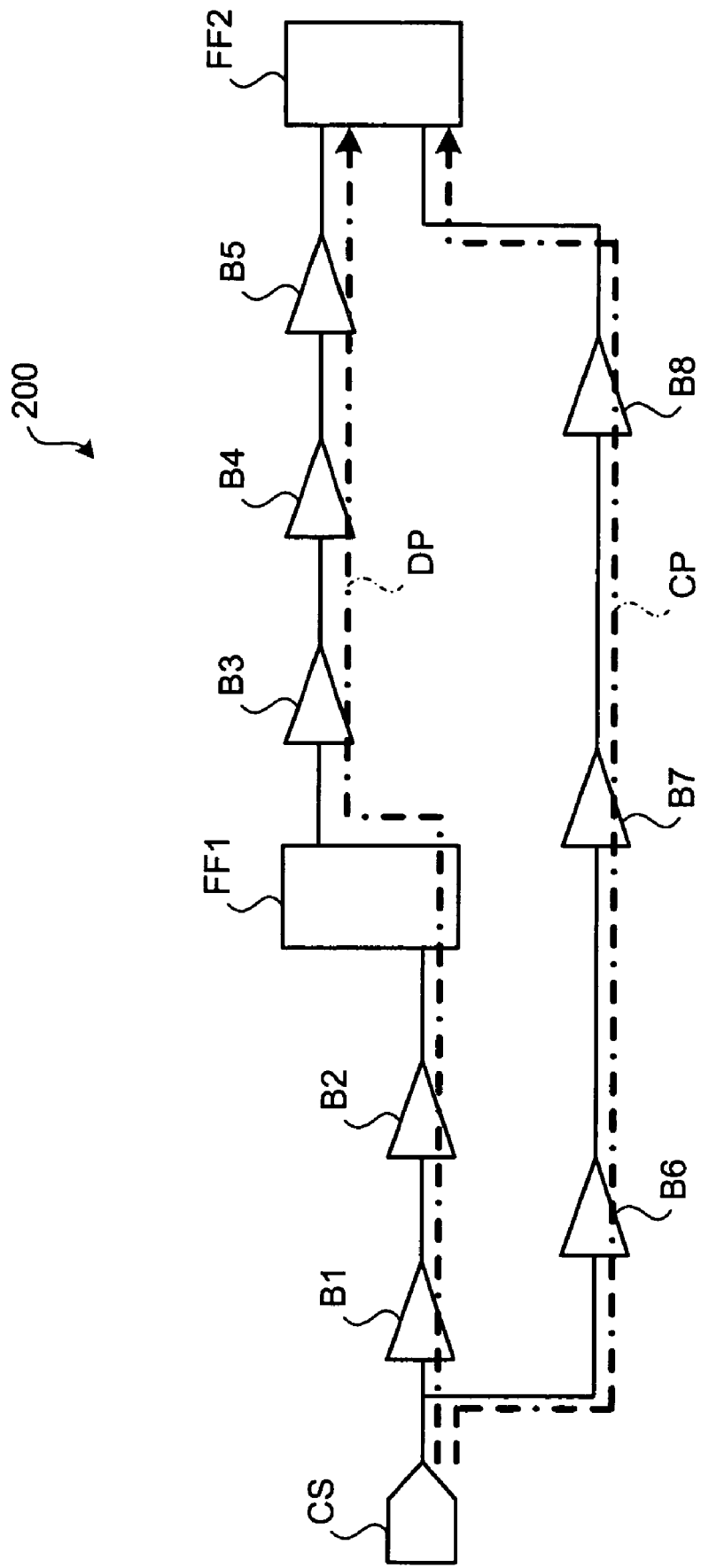
FIG. 2 is a circuit diagram showing one example of an object circuit according to the present embodiment.

FIG. 2 is a circuit diagram showing one example of an object circuit according to the present embodiment. An object circuit 200 is constituted of a clock source CS, two FF1 and FF2, and eight buffers B1 to B8. In the object circuit 200, a route from the clock source CS to a data pin of the FF2 via the buffers B1 to B5 is a data path DP, while a route from clock source CS to a clock pin of the FF2 via the buffers B6 to B8 is a clock path CP.

Figure 3:
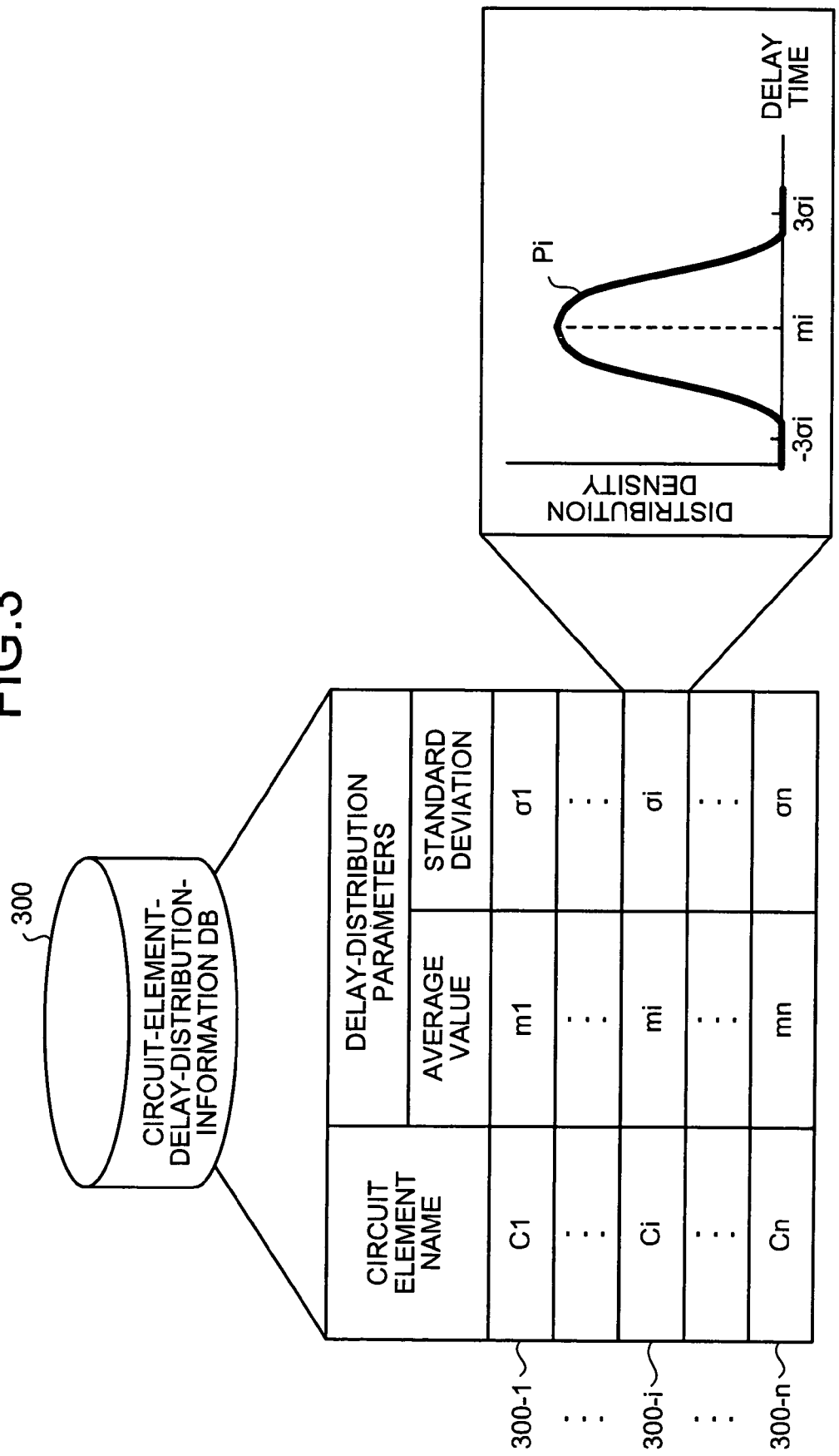
FIG. 3 is an explanatory diagram showing storage contents in a circuit-element-delay-distribution information database.

FIG. 3 is an explanatory circuit showing storage contents in a circuit-element-delay-distribution information database. A circuit-element-delay-distribution information database 300 stores circuit-element-delay-distribution information 300-1 to 300-n for each circuit element. The circuit-element-delay-distribution information 300-1 to 300-n has a circuit element name and a delay distribution parameter of clock for each circuit element.

The delay distribution parameter has an average value of clock-delay values in the circuit element and a standard deviation. For example, a circuit element 300-$i$ with a circuit element name Ci has an average value mi of clock-delay values and a standard deviation σi, and its distribution function is a probability density function Pi forming a normal distribution. As the circuit element, a buffer, a inverter, a logic gate, or the like can be employed.

FIG. 4 is a block diagram showing a functional configuration of the clock-delay analyzing apparatus according to the present embodiment. The clock-delay analyzing apparatus 400 includes the circuit-element-delay-distribution information database 300 shown in FIG. 3, a input unit 401, an extracting unit 402, a data-path-delay-distribution-information calculating unit 403, a clock-path-delay-distribution-information calculating unit 404, a delay-difference-distribution-information calculating unit 405, and a clock-delay-value calculating unit 406.

The input unit 401 receives input of circuit information 410 into the object circuit 200. The circuit information 410 is information indicating a connection relationship among circuit elements constituting the object circuit 200. For example, a net list obtained by logically composing HDL descriptions of RTL can be used.

The extracting unit 402 extracts delay-distribution information of respective circuit elements constituting the data path DP and delay-distribution information of the respective circuit elements constituting the clock path CP from among the circuit-element-delay-distribution information 300-1 to 300-n stored in the circuit-element-delay-distribution information database 300. The delay-distribution information is described in the circuit information 410. In the object circuit 200 shown in FIG. 2, since the circuit elements constituting the data path DP are the buffers B1 to B5, the extracting unit 402 extracts delay-distribution information for the buffers B1 to B5. For example, when the circuit element name of the buffer B1 is "C1", a delay distribution parameter constituted of the average value "m1" and the standard deviation "σ1" is extracted as the delay-distribution information 300-1 of the buffer B1.

Similarly, in the object circuit 200 shown in FIG. 2, since the circuit elements constituting the clock path CP are the buffers B6 to B8, the extracting unit 402 extracts delay-distribution information of the butters B6 to B8. For example, when a circuit element name of the buffer B6 is "C6", a delay distribution parameter constituted of an average value "m6" and a standard deviation "σ6" is extracted as the delay-distribution information 300-6 of the buffer B6.

The data-path-delay-distribution-information calculating unit 403 calculates the delay-distribution information of the data path DP using the delay-distribution information of the respective circuit elements constituting the data path DP and extracted by the extracting unit 402. Specifically, the delay-distribution information of the data path DP is calculated by convoluting the delay-distribution information of the respective circuit elements constituting the data path DP, namely using a mathematical convolution.

When average values of the clock delays in the buffers B1 to B5 constituting the data path DP shown in FIG. 2 are represented as md1 to md5, and the standard deviations thereof are represented as σd1 to σd5, an average value mda and a standard deviation σda of the clock delay that are delay distribution parameters of the delay-distribution information for the data path DP can be calculated by Eqs. (1) and (2).

$$mda = md1 + md2 + md3 + md4 + md5 \quad (1)$$

$$\sigma da = \sqrt{\sigma d1^2 + \sigma d2^2 + \sigma d3^2 + \sigma d4^2 + \sigma d5^2} \quad (2)$$

In this case, data path delay-distribution information can be expressed by a normal distribution using the average value mda and the standard deviation σda as delay distribution parameters.

The clock-path-delay-distribution-information calculating unit 404 calculates delay-distribution information of the clock path CP using the delay-distribution information of the respective circuit elements constituting the clock path CP and extracted by the extracting unit 402. Specifically, the delay-distribution information of the clock path CP is calculated by convoluting the delay-distribution information of the respective circuit elements constituting the clock path CP, namely, using mathematical convolution.

When the average values of the clock delays in the buffers B6 to B8 constituting the clock path CP shown in FIG. 2 are represented as mc1 to mc3, and the standard deviations thereof are represented as σc1 to σc3, an average value mck and a standard deviation σck of the clock delay that are delay distribution parameters of the delay-distribution information for the clock path CP can be calculated by Eqs. (3) and (4).

$$mca = mc1 + mc2 + mc3 \quad (3)$$

$$\sigma ck = \sqrt{\sigma c1^2 + \rho c2^2 + \sigma c3^2} \quad (4)$$

In this case, clock-path-delay-distribution information can be expressed by a normal distribution using the average value mck and the standard deviation σck as the delay distribution parameters.

A delay distribution of the data path DP and a delay distribution of the clock path CP are shown. FIG. 5 is a graph showing a delay distribution Pda of the data path DP and a delay distribution Pck of the clock path CP. The delay distribution Pda is a probability density function forming a normal distribution using the delay distribution parameters (mda and σda) for the delay-distribution information to the data path DP. The delay distribution Pck is a probability density function forming a normal distribution using the delay distribution parameters (mck and σck) for the delay-distribution information to the clock path CP.

In FIG. 5, "a" denotes the maximum delay value of the data path DP obtained from a timing analysis (STA), and "b" denotes the minimum delay value of the clock path CP obtained from the timing analysis (STA). Accordingly, S1 (S1=b−a) denotes the clock-delay value in the conventional approach. Similarly, in FIG. 5, "c" denotes a statistical maximum delay value of the data path DP and "d" denotes a statistical minimum delay value of the clock path CP. Accordingly, S2 (S2=d−c) denotes the clock-delay value obtained according to the conventional statistical approach.

In FIG. 4, the delay-difference-distribution-information calculating unit 405 calculates delay-difference-distribution information between the data path DP and the clock path CP using the delay-distribution information of the data path DP calculated by the data-path-delay-distribution-information calculating unit 403 and the delay-distribution information of the clock path PC calculated by the clock-path-delay-distribution-information calculating unit 404.

The delay-difference-distribution information between the data path DP and the clock path CP is a normal distribution is represented using delay distribution parameters constituted of an average value m and a standard deviation σ of the clock-delay values in the delay difference distribution between the data path DP and the clock path CP. For example, in the object circuit 200 shown in FIG. 2, the average value m of the delay difference distribution is calculated from a difference between the average value mda of the delay distribution Pda of the data path DP obtained using Eq. (1) and the average value mck of the delay distribution Pck of the clock path CP obtained using Eq. (3), as $$m = mda - mck \quad (5)$$

Similarly, a standard deviation σ of the delay difference distribution is calculated using a standard deviation σda of the delay distribution Pda of the data path DP obtained using Eq. (2) and the standard deviation σck of the delay distribution Pck of the clock path CP obtained using Eq. (4), as $$\sigma = \sqrt{\sigma da^2 + \sigma dk^2} \quad (6)$$

In this case, the delay-difference-distribution information can be expressed by a normal distribution including the average value m and the standard deviation σ as the delay distribution parameters. FIG. 6 is a graph showing a delay difference distribution P according to the present embodiment. The delay difference distribution P is a probability density function forming a normal distribution using the delay distribution parameters (m and σ) obtained using Eqs. (5) and (6).

In FIG. 4, the clock-delay-value calculating unit 406 calculates a clock-delay value in the object circuit 200 based upon the delay-difference-distribution information calculated by the delay-difference-distribution-information calculating unit 405. The clock-delay value is a so-called slack value and it can be obtained from the delay difference distribution P. For example, S3 (S3=m−3σ) is the clock-delay value in the object circuit 200 to be obtained.

Specifically, the clock-delay value S3 can be developed as $$\begin{aligned} S3 &= m - 3\sigma \\ &= mck - mda - 3\sqrt{\sigma d1^2 + \sigma d2^2 + \sigma d3^2 + \sigma d4^2 + \sigma d5^2} \end{aligned} \quad (7)$$

The clock-delay value S2 according to the statistical approach shown in FIG. 5 can be developed as $$\begin{aligned} S2 &= mck - 3\sigma ck - (mda + 3\sigma da) \\ &= mck - mda - 3(\sigma ck + \sigma da) \end{aligned} \quad (8)$$

Eq. (9) can be obtained by taking a difference between Eqs. (7) and (8).

$$\sigma ck + \sigma das \geq \sqrt{\sigma d1^2 + \sigma d2^2 + \sigma d3^2} \quad (9)$$

In Eq. (9), the right-hand side is the standard deviation σ of the delay difference distribution P (see Eq. (6)) and it represents the closing item in Eq. (7) in the clock-delay value S3. On the other hand, the left-hand side represents the closing item in Eq. (8) in the clock-delay value S2. Since both the standard deviations σck and σda satisfy σck>0 and σda>0, the value of the right-hand side of Eq. (9) becomes equal to or less than the value of the left-hand side. Accordingly, the clock-delay value S3 takes a larger slack than those of the clock-delay values S1 and S2 owing to S2≦S3.

Specifically, functions of the input unit 401, the extracting unit 402, the data-path-delay-distribution-information calculating unit 403, the clock-path-delay-distribution-information calculating unit 404, the delay-difference-distribution-information calculating unit 405, and the clock-delay-value calculating unit 406 can be realized by the CPU 101 executing programs recorded in such a recording medium as the ROM 102, the RAM 103, or the HD 105 or by the I/F 109.

Figure 7:
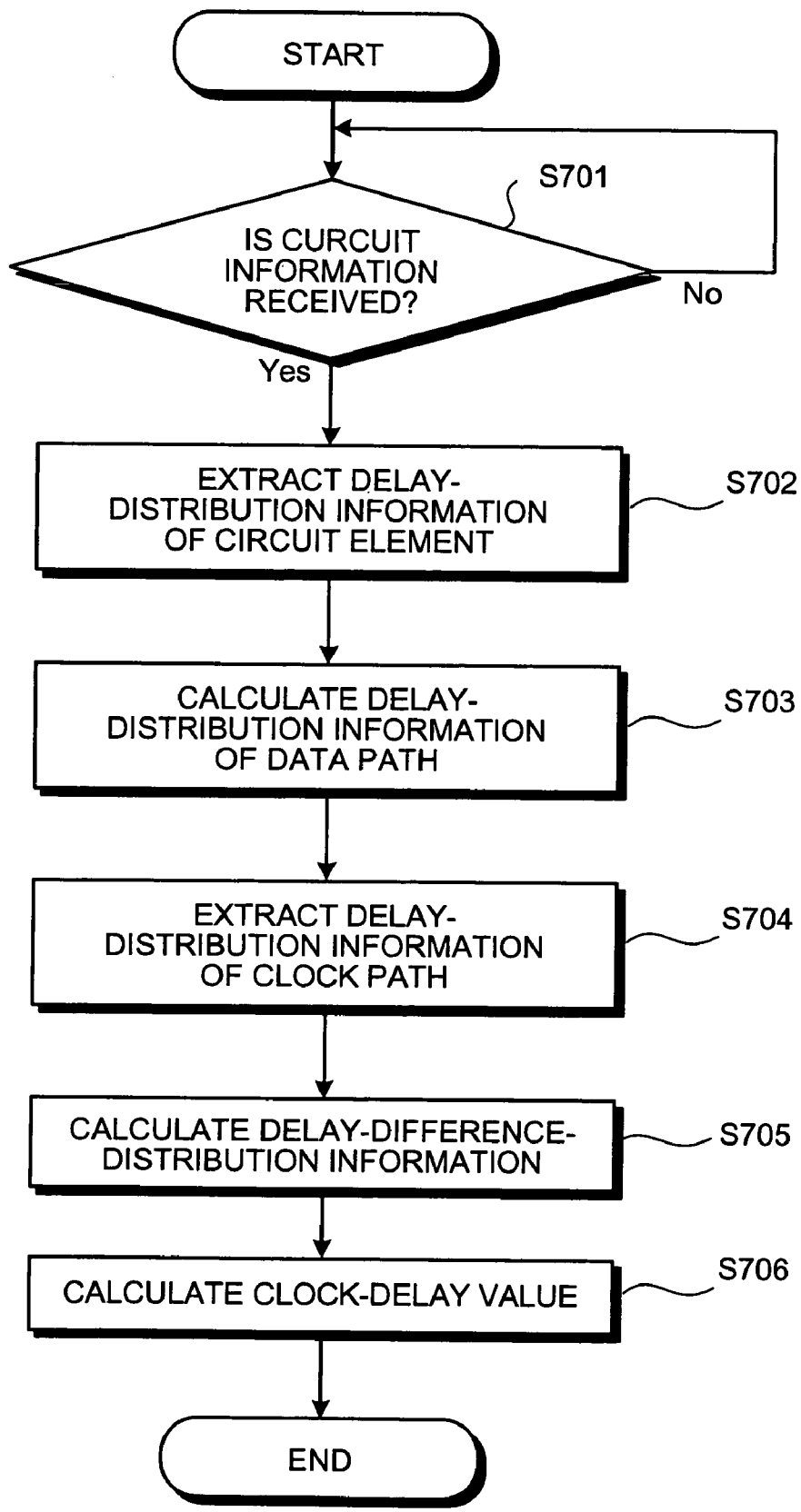
FIG. 7 is a flowchart of a clock delay analyzing processing procedure according to the present embodiment.

FIG. 7 is a flowchart of a clock delay analyzing processing procedure according to the present embodiment. When circuit information 410 is inputted into the input unit 401 ("YES" at step S701), delay-distribution information in the circuit elements constituting the data path DP and the clock path CP are extracted from the circuit-element-delay-distribution information database 300 by the extracting unit 402 (step S702).

The delay-distribution information (the average value mda and the standard deviation σda) of the data path DP are calculated by statistical convolution performed in the data-path-delay-distribution-information calculating unit 403 (step S703). Similarly, the delay-distribution information (the average value mck and the standard deviation σck) of the clock path CP are calculated by a statistical convolution in the clock-path-delay-distribution-information calculating unit 404 (step S704). Thereby, the normal distributions Pda and Pck shown in FIG. 5 can be obtained.

Thereafter, the delay-difference-distribution information (the average value m and the standard deviation σ) between the data path DP and the clock path CP are calculated in the delay-difference-distribution-information calculating unit 405 (step S705). Thereby, the delay difference distribution P shown in FIG. 6 can be obtained. Finally, the clock-delay value S3 in the object circuit 200 is calculated from the delay difference distribution P (step S706).

According to the present embodiment, the minimum slack value considering the statistical factor can be estimated by using the delay difference distribution P of the clock path CP and the data path DP, and the pessimistic margin (estimation) in the conventional approach can be relaxed. Thereby, improvement of up to about 15% can be achieved in actual LSI data as compared with the conventional approach. Therefore, an efficient design work with reduced return can be realized.

In the circuit-element-delay-distribution information database 300 according to the present embodiment, the delay distribution parameters constituted of the average value m and the standard deviation σ representing the normal distribution have been used as the delay-distribution information in each circuit element, but a probability distribution different from the normal distribution may be developed due to different in kind or characteristic of a circuit element to be used. In such a circuit element, a delay distribution parameter shown in FIG. 8 is stored in the circuit-element-delay-distribution information database 300.

Figure 8:
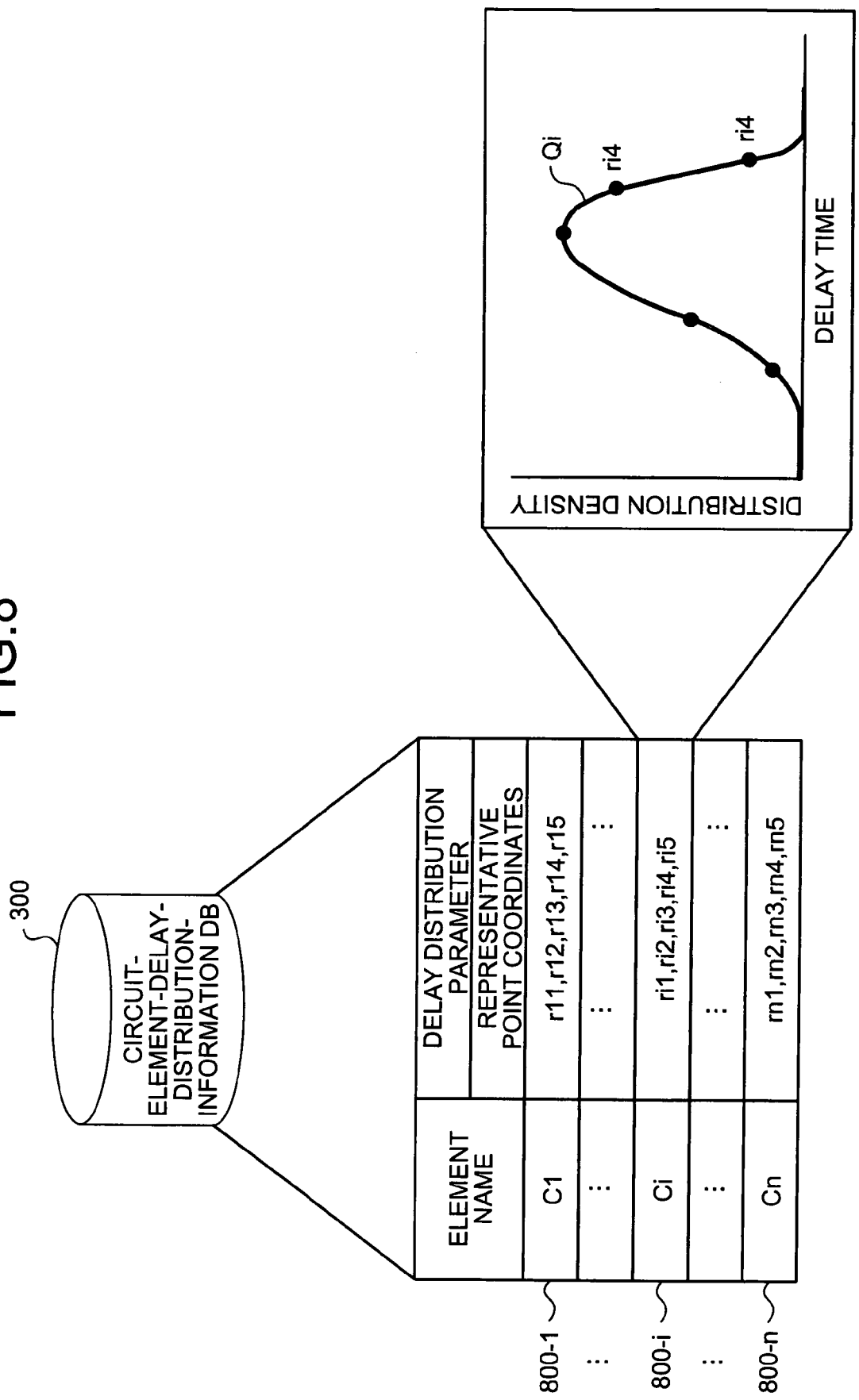
FIG. 8 is an explanatory diagram showing other storage contents in the circuit-element-delay-distribution information database.

FIG. 8 is an explanatory diagram showing other storage contents in the circuit-element-delay-distribution information database 300. The circuit-element-delay-distribution-information database 300 stores circuit-element-delay-distribution information 800-1 to 800-n for respective circuit elements. The circuit-element-delay-distribution information 800-1 to 800-n have delay distribution parameters showing representative point coordinates for the respective circuit elements. In the circuit-element-delay-distribution information 800-$i$, for example, when a clock delay in a circuit element with a circuit element name Ci depends on a probability distribution Qi, the representative point coordinates ri1 to ri5 are stored as the delay distribution parameters. Thereby, the probability distribution Qi can be represented by a probability density function obtained from the representative point coordinates ri1 to ri5.

In this case, in the data-path-delay-distribution-information calculating unit 403 and the clock-path-delay-distribution-information calculating unit 404, the delay-distribution information in the data path DP and the delay-distribution information in the clock path CP can be calculated by convoluting the probability density functions of the respective circuit elements. Even a circuit element having irregular probability distribution can be satisfied by using the circuit-element-delay-distribution information 800-1 to 800-n shown in FIG. 8, so that versatility can be improved.

As described above, according to the present embodiment, relaxation in pessimism in design margin can be achieved by estimating a stable minimum clock-delay value (slack) in the object circuit accurately.

The clock-delay analyzing method can be realized by causing such a computer as a personal computer or a workstation to execute a program prepared in advance. The program can be recorded on such a computer-readable recording medium as a hard disk, a flexible disk, a CD-ROM, an MO, or a DVD and it can be read from the recording medium to be performed by a computer. The program may be a transmission medium that can be distributed via such a network as Internet.

According to the present invention, relaxation to pessimism in design margin can be achieved.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An apparatus for analyzing a clock delay of a target circuit, comprising:
    an input unit receiving circuit information on the target circuit;
    a first calculating unit calculating a first parameter and a second parameter based on the received circuit information wherein the first parameter determines a first probability density function of a delay of a data path of the target circuit, and the second parameter determines a second probability density function of a delay of a clock path of the target circuit;
    a second calculating unit calculating a third parameter that determines a third probability density function of a difference between the delay of the data path and the delay of the clock path, based on the first parameter and the second parameter; and
    a third calculating unit calculating a clock-delay value of the target circuit, based on the third probability density function;
    a storage unit storing information on a delay of each circuit element of the target circuit; and
    an extracting unit extracting, from the storage unit based on the circuit information, first information on delays of circuit elements on the data path and second information on delays of circuit elements on the clock path; and the first calculating unit calculating the first parameter and the second parameter based on the first information and the second information, respectively.

2. The apparatus according to claim 1, wherein the first calculating unit calculates the first parameter and the second parameter by performing a convolution, based on the first information and the second information, respectively.

3. The apparatus according to claim 1, wherein:
the first parameter is any one of an average value, a standard deviation, and a set of coordinates of the first probability density function;
the second parameter is any one of an average value, a standard deviation, and a set of coordinates of the second probability density function; and
the third parameter is any one of an average value, a standard deviation, and a set of coordinates of the third probability density function.

4. A method of analyzing a clock delay in a circuit, comprising:
receiving circuit information on the circuit;
calculating first delay-distribution information of a data path of the circuit, using second delay-distribution information of each of a plurality of circuit elements constituting the data path;
calculating third delay-distribution information of a clock path of the circuit, using fourth delay-distribution information of each of a plurality of circuit elements constituting the clock path, based on the received circuit information;
calculating delay-difference-distribution information between the data path delay and the clock path delay, using the calculated first delay-distribution information and the calculated third delay-distribution information; and
calculating a clock-delay value of the circuit, based on the calculated delay-difference-distribution information;
storing delay-distribution information of a circuit element; and
extracting the second delay-distribution information and the fourth delay-distribution information described by the circuit information from the stored delay-distribution information, wherein:
the calculating the first delay-distribution information includes calculating the first delay-distribution information using the extracted second delay-distribution information, and
calculating the third delay-distribution information, including calculating the third delay-distribution information by using the extracted fourth delay-distribution information.

5. The method according to claim 4, wherein:
the calculating the first delay-distribution information further comprises performing a convolution of the second delay-distribution information, and
calculating the third delay-distribution information further comprises performing a convolution of the fourth delay-distribution information.

6. The method according to claim 4, wherein:
the first parameter is any one of an average value, a standard deviation, and a set of coordinates of the first probability density function;
the second parameter is any one of an average value, a standard deviation, and a set of coordinates of the second probability density function; and
the third parameter is any one of the average value, the standard deviation, and a set of coordinates of the third probability density function.

7. A computer-readable recording medium storing a computer program for analyzing a clock delay in a circuit, wherein the computer program causes a computer to execute:
receiving circuit information on the circuit;
calculating first delay-distribution information of a data path of the circuit using second delay-distribution information of each of a plurality of circuit elements constituting the data path; and
calculating third delay-distribution information of a clock path of the circuit using fourth delay-distribution information of each of a plurality of circuit elements constituting the clock path, based on the received circuit information;
calculating second delay-difference-distribution information between the data path and the clock path using the calculated first delay-distribution information and the calculated third delay-distribution information; and
calculating a clock-delay value of the circuit based on the calculated second delay-difference-distribution information;
storing delay-distribution information of a circuit element;
extracting the second delay-distribution information and the fourth delay-distribution information described in the circuit information from the stored delay-distribution information;
calculating the first delay-distribution information further comprises calculating the first delay-distribution information using the extracted second delay-distribution information; and
calculating the third delay-distribution information further comprises calculating the third delay-distribution information using the extracted fourth delay-distribution information.

8. The computer-readable recording medium according to claim 7, wherein the computer program further causes the computer to execute:
calculating the first delay-distribution information by performing a convolution of the second delay-distribution information, and
calculating the third delay-distribution information by performing a convolution of the fourth delay-distribution information.

9. The computer-readable recording medium according to claim 7, wherein:
the first parameter is any one of an average value, a standard deviation, and a set of coordinates of the first probability density function;
the second parameter is any one of an average value, a standard deviation, and a set of coordinates of the second probability density function; and
the third parameter is any one of an average value, a standard deviation, and a set of coordinates of the third probability density function.

* * * * *